(12) United States Patent
Frank et al.

(10) Patent No.: US 12,176,690 B2
(45) Date of Patent: Dec. 24, 2024

(54) HIGH-VOLTAGE POWER DISTRIBUTOR

(71) Applicant: NEXANS, Courbevoie (FR)

(72) Inventors: Christoph Frank, Floss (DE); Tobias Kroop, Floss (DE); Ulrich Döllinger, Floss (DE); Wolfgang Ehlich, Floss (DE)

(73) Assignee: NEXANS, Courbevoie (FR)

( * ) Notice: Subject to any disclaimer, the term of this patent is extended or adjusted under 35 U.S.C. 154(b) by 0 days.

(21) Appl. No.: 18/071,441

(22) Filed: Nov. 29, 2022

(65) Prior Publication Data

US 2023/0208128 A1   Jun. 29, 2023

(30) Foreign Application Priority Data

Dec. 2, 2021  (EP) .................................. 21306696

(51) Int. Cl.
| | | |
|---|---|---|
| H05K 9/00 | (2006.01) | |
| H01R 4/48 | (2006.01) | |
| H01R 4/60 | (2006.01) | |
| H01R 43/048 | (2006.01) | |
| H02G 15/117 | (2006.01) | |
| H01R 4/02 | (2006.01) | |
| H01R 4/20 | (2006.01) | |
| H01R 4/70 | (2006.01) | |

(52) U.S. Cl.
CPC ........... *H02G 15/117* (2013.01); *H01R 4/489* (2013.01); *H01R 4/60* (2013.01); *H01R 43/048* (2013.01); *H05K 9/0098* (2013.01); *H01R 4/029* (2013.01); *H01R 4/20* (2013.01); *H01R 4/70* (2013.01)

(58) Field of Classification Search
CPC ................................................... H05K 9/0098
See application file for complete search history.

(56) References Cited

U.S. PATENT DOCUMENTS

| | | | |
|---|---|---|---|
| 6,916,205 B1 * | 7/2005 | Kaneko | H01R 9/0524 439/98 |
| 9,979,167 B1 * | 5/2018 | Volpone | H01B 13/01263 |
| 2018/0138640 A1 | 5/2018 | Maesoba | |
| 2019/0288416 A1 * | 9/2019 | Wimmer | H01R 13/6593 |
| 2020/0021062 A1 * | 1/2020 | Elkhatib | H01R 13/6592 |
| 2021/0249803 A1 * | 8/2021 | Kojima | H01B 7/0225 |

FOREIGN PATENT DOCUMENTS

| | | |
|---|---|---|
| CN | 106 374 282 | 12/2018 |
| DE | 10 2008 018403 | 10/2009 |
| EP | 3 425 741 | 1/2019 |
| WO | 03/067718 | 8/2003 |

OTHER PUBLICATIONS

European Search Report dated Aug. 18, 2022.

* cited by examiner

*Primary Examiner* — Hung V Ngo
(74) *Attorney, Agent, or Firm* — Sofer & Haroun, LLP

(57) ABSTRACT

A power distributor (200) with at least two incoming lines (101-103) and a method for manufacturing such a power distributor is suggested. Each incoming line has a conductor (106,107) and an individual screen (114). The conductors of the incoming lines are connected at a connection point (V1, V2), which is enclosed by a screen shield (201) that contacts each individual screen (114) of the incoming lines. The screen shield (201) is made from electrically conducting plastic material. Screen shields made from electrically conducting plastic material is easier to manufacture and less expensive than metal screen shields.

8 Claims, 3 Drawing Sheets

HIGH-VOLTAGE POWER DISTRIBUTOR

RELATED APPLICATION

This application claims the benefit of priority from European Patent Application No. 21 306 696.2, filed on Dec. 2, 2021, the entirety of which are incorporated by reference.

FIELD

The present disclosure firstly relates to a high-voltage power distributor comprising a screen shield to ensure electromagnetic compatibility of the power distributor. Secondly, the present disclosure relates to a screen shield for such a power distributor. Furthermore, the present disclosure relates to a method for manufacturing a high-voltage power distributor.

BACKGROUND

In electric cars it is a requirement to distribute electric energy from a battery or a generator to consumers of this electric energy such as an electric driving motor, actuators, heaters or cooling equipment just to name a few examples. To this end, it is necessary to provide for electric connections between conductors of electric lines. In hybrid cars and purely electric cars many times high-voltage systems are utilized with voltages in the range of 60V-1500V DC and 30V-1000V AC. For such high-voltage electric systems electric lines need a screen to shield high electric fields. In high-voltage power distributors distributing electric power for example from the battery to several electric consumers conductors of different electrical lines or cables are connected. In the interest of electromagnetic compatibility also the one or several connection points between the conductors of the different electrical lines need an effective screen.

Today the screen in conventional power distributors is made from metal, for instance copper, brass or steel or any other metal or alloy having sufficient electric conductivity. However, manufacturing of metallic screens is expensive.

In view of the mentioned limitations of existing power distributors, there remains a desire for a high-voltage power distributor that has a sufficient electromagnetic compatibility that is less expensive to manufacture.

SUMMARY

According to a first aspect the present disclosure suggests a power distributor with at least two incoming lines. Each line comprises a conductor and an individual screen. The conductors of the incoming lines are connected at a connection point, which is enclosed by a screen shield that contacts each individual screen of the incoming lines. The screen shield is made from electrically conducting plastic material.

A screen shield made from electrically conducting plastic material is easier to manufacture and less expensive than the metal screen shield. It is noted that the incoming lines may be of a single core type with a single conductor. But the incoming lines may also be of a multicore type with several conductors. In this case only one single individual screen encloses the multiple conductors of the multicore line.

Advantageously, the screen shield comprises elastic springs contacts contacting the screens of the incoming lines. The elastic spring contacts facilitate making a good electrical contact to the screens of the incoming lines. At the same time the elastic spring contacts can compensate for mechanical tolerances of the components making the electrical contact.

It has been found useful to make the elastic spring contacts from metal. Most metals have good electrical conductivity and are mechanically stable.

In the interest of a further improved electrical contact, the elastic spring contacts comprise one or several spring tongues. Each spring tongue establishes a contact point which provides for a resilient electrical contact. This can be particularly advantageous to make the electrical contact resistant against vibrations.

In one embodiment the elastic springs are molded together with the screen shield. According to this approach the elastic spring contacts are an integral part of the screen shield, which makes the screen shield even more efficient to manufacture.

In a particularly advantageous embodiment, the elastic spring contacts are molded together as in-mold parts with the screen shield. The spring contacts establish a metal-to-metal contact to the screen of the incoming lines. This metal-to-metal contact provides for a good electrical conductivity. At the same time, the electrical contact between the screen shield made from electrically conducting plastic material to the metal spring contacts is better than just a friction-locked contact between metal and electrically conducting plastic material in the case when the spring contacts are also made from electrically conducting plastic material.

Advantageously, that the elastic spring contacts establish an electrically conducting path connecting the elastic spring contacts with each other. In this way the spring contacts contacting the screens of the lines provide for an electrically conducting path between the screens. The electrically conducting path enables to transfer screen currents from line screen to line screen of the lines.

In a practical embodiment the incoming lines comprise a plurality of conductors, which are connected with other conductors of the other incoming lines at a plurality of connection points.

In a further development the power distributor comprises an insulation body which is arranged inside the screen shield. The insulation body is adapted to separate connection points between the conductors. The insulation body is a simple concept to assure mechanical and electrical reliability of the power distributor.

In this case it has been found useful to arrange spacer between conductors of different incoming lines fixing the connection points at predefined positions inside the insulation body. The spacers cooperate with the insulation body to fix the connection points in the insulating body.

In an advantageous further development, the power distributor comprises a housing made of insulating plastic material enclosing the screen shield. The housing protects the power distributor from environmental influences such as dirt, humidity, and mechanical stress.

According to a second aspect, the present disclosure suggests a screen shield molded from electrically conducting plastic material with in-mould metallic spring contacts. This type of screen shield is easy to manufacture and at the same time provides for good electrical contact between the screen shield and screens of incoming lines in a power distributor.

According to a third aspect, the present disclosure suggests a method for manufacturing a power distributor according to the first aspect of the present disclosure. The method comprises removing an outer insulation jacket of incoming lines;
removing an insulation form conductors of the incoming lines;
electrically connecting the conductors of the incoming lines;
lifting a screen from an inner insulating jacket to make room for an under-crimp sleeve;
crimping the under-crimp sleeve onto an insulating jacket;
placing the screen back onto the under-crimp sleeve are fixed on the insulating jacket, the screen is folded back onto the under-crimp sleeve;
placing the crimp sleeve on top of the screen and the under-crimp sleeve;
crimping the crimp sleeve;
enclosing bare conductors in an insulating body;
enclosing the insulating body in a screen shield according to second aspect of the present disclosure.

In the development the method further comprises arranging an electrically insulating housing around the screen shield.

BRIEF DESCRIPTION OF THE DRAWINGS

Exemplary embodiments of the present disclosure are illustrated in the drawings and are explained in more detail in the following description. In the figures, the same or similar elements are referenced with the same or similar reference signs. It shows.

In the figures the same or similar components are labelled with the same or similar reference signs.

DETAILED DESCRIPTION

Figure 1:
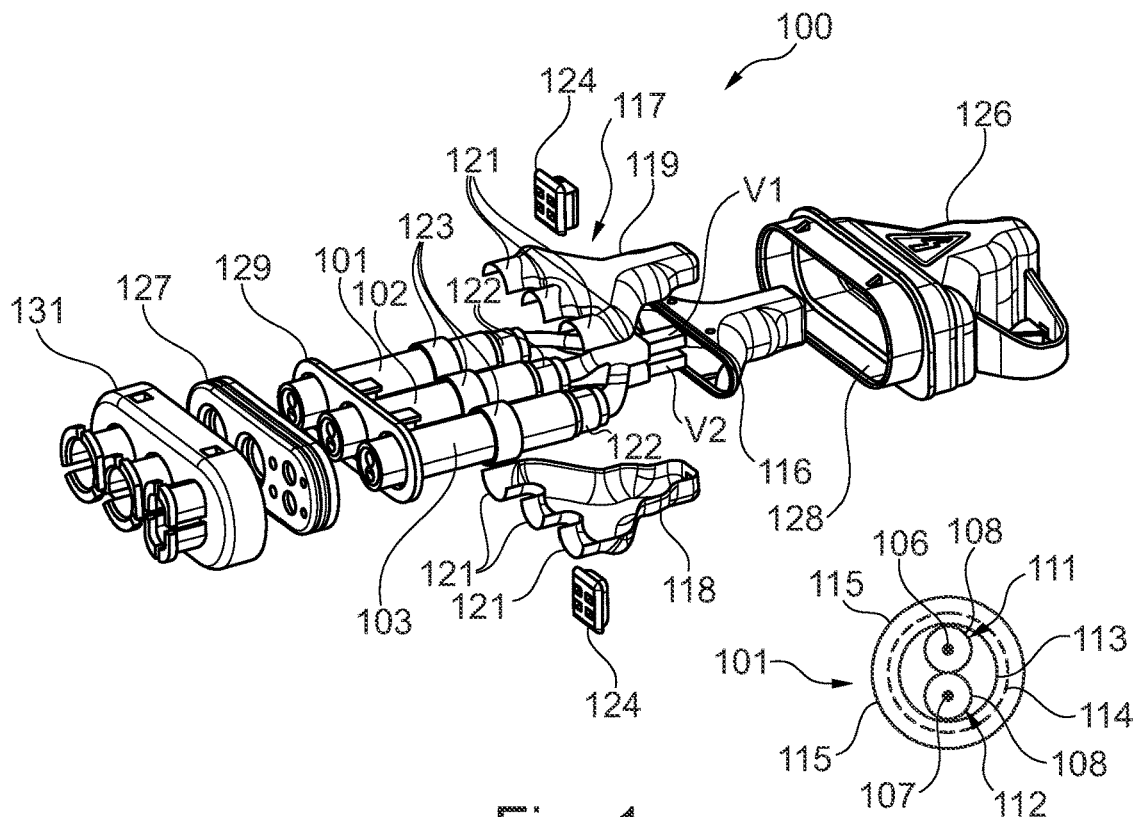
FIG. 1 an exploded view of a conventional high-voltage power distributor.

FIG. 1 shows an exploded view of a conventional power distributor 100 for connecting conductors of incoming lines 101-103. Each one of the incoming lines 101-103 comprises two conductors 106, 107 as it is shown in the insertion in FIG. 1 where the structure of line 101 is shown in greater detail as a representative example for all lines 101-103. The conductors 106, 107 are covered by an insulation 108 to form individual lines 111, 112. The individual lines 111, 112 are sheathed by an inner insulating jacket 113. The insulating jacket 113 is surrounded by a screen 114 made of a wire braid, for instance. In other embodiments the screen 114 is made of stripes of thin metal foil that is wound in a helical manner around the jacket 113. On top of the wire braid of the screen 114 there is an outer insulation jacket 115. In the drawing, distances are shown between the individual components to improve their distinguishability. In reality such distances may not exist.

The conductors 106 of the incoming lines 101-103 are connected at a connection point V1 by ultrasonic welding for instance. Likewise, the conductors 107 of the incoming lines 101-103 are connected at a connection point V2. An insulation body 116 accommodates the connection points V1, V2. Inside the insulation body 116 the connection points are separated by a wall (not shown in FIG. 1) preventing direct contact between the connection points V1, V2. The power distributor 100 comprises a screen shield 117 including a lower half shell 118 and an upper half shell 119. All bare conductors or current carrying metallic parts are enclosed by the insulation body 116. Therefore, the electrically conducting half shells 118, 119 can be placed on top of the insulation body 116 to enclose the connection points V1, V2 and those portions of the conductors 106, 107 which are not covered by the screen 114 of the incoming lines 101-103. To avoid a gap between the screens 114 of the incoming lines 101-103 and the screen shield 117, the half shells 118, 119 are provided with half circular extensions 121 forming circular enclosures for the screens 114 of the incoming lines 101-103 when the half shells 118, 119 are put together in their mounted position. The extensions 121 make electrical contact to the screens 114. Proper electrical contact 20 between the screen shield 117 and the screens 114 is achieved by means of under-crimp sleeves 122 and crimp sleeves 123. The under-crimp sleeves 122 are crimped onto the insulating jacket 113 of the incoming lines 101-103, with the screen 114 of the lines 101-103 folded upwards by 90°. Then the half shells 118, 119 are placed around the connection points V1, V2. The screens 114 of the lines 101-103 are then placed on the extensions 121 of the screen shield 117 and electrically connected to the screen shield 117 with the crimp sleeves 123. The crimp sleeves 123 also hold the half shells 118, 119 together.

Before joining the half shells 118, 119, spacers 124 are arranged in the gaps between the individual lines 111, 112 of the incoming lines 101-103. The spacers 124 hold the connection points V1, V2 in place inside the insulation body 116. After the half shells 118, 119 are connected by the crimp sleeves 123, the spacers 124 fix the connection points V1, V2 in place inside the insulation body 116.

For protection against environmental influences such as dirt, humidity etc. the power distributor 100 comprises a housing 126 to enclose the electrical parts of the power distributor 100. A sealing mat 127 tightly closes an opening 128 of the housing 126. A stopper 129 cooperates with the housing 126 to secure the correct positioning of the sealing mat 127 in the opening 128 of the housing 126. A cover 131 closes the housing and is held in position by cooperating latching means provided on the housing 126 and the cover 131, respectively.

Figure 2:
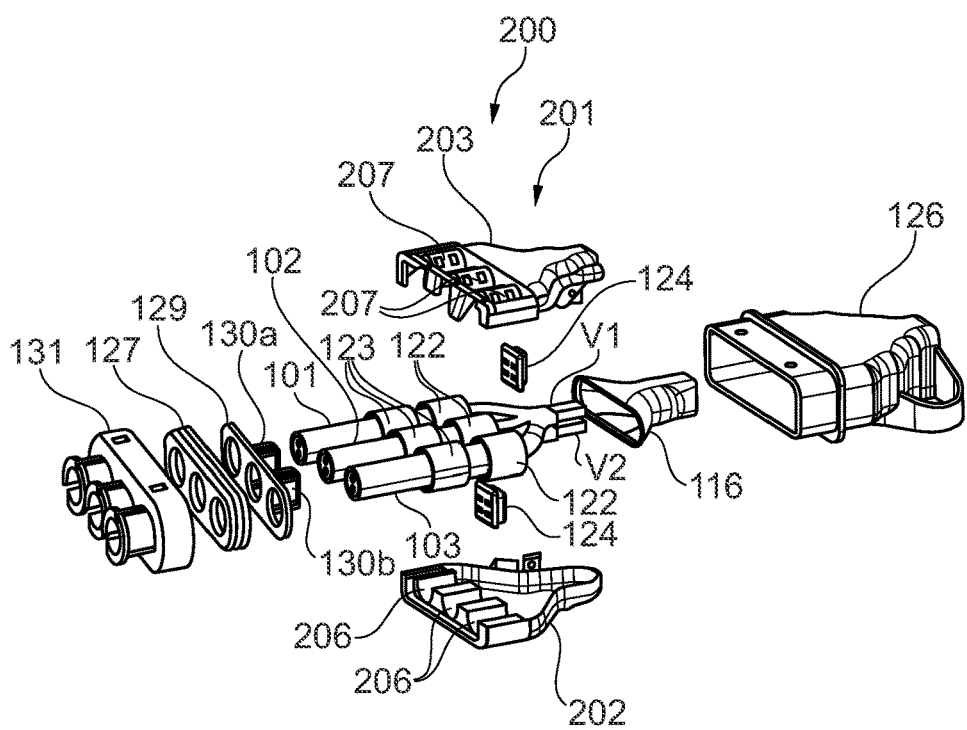
FIG. 2 an exploded view of a high-voltage power distributor according to the present disclosure.

FIG. 2 illustrates a high-voltage power distributor 200 according to the present disclosure. The power distributor 200 is structured very similar to the power distributor 100 shown in FIG. 1. One important difference between both power distributors 100, 200 is that the power distributor 200 comprises a screen shield 201 which is made from electrically conducting plastic material. The screen shield 201 is made up of a lower half shell 202 and an upper half shell 203. When the half shells 202, 203 are combined to form the screen shield 201, the screen shield 201 provides for three channels 204 (FIG. 4) for receiving the incoming lines 101-103. Like in the high voltage distributor 100 described in connection with FIG. 1, the under-crimp sleeves 122 are crimped onto the insulating jacket 113 of the incoming lines 101-103, with the screen 114 of the lines 101-103 folded upwards by 90°. After the under-crimp sleeve 122 are fixed on the insulating jacket 113, the screen 114 is folded back onto the under-crimp sleeve 122 and fixed by crimp sleeve 123 which is placed on top of the screen 114 and the under-crimp sleeve 122. The crimp sleeve 123 is crimped in this position and establishes an electrical connection to the screen 114.

The mounting of the other components of the high voltage distributor 200 is essentially the same as it has been described in connection with the high voltage distributor 100. Specifically, the conductors 106 of the incoming lines 101-103 are connected at a connection point V1 for instance by ultrasonic welding. Likewise, the conductors 107 of the incoming lines 101-103 are connected at a connection point V2. An insulation body 116 accommodates the connection points V1, V2. Inside the insulation body 116 the connection points are separated by a wall (not shown) preventing direct contact between the connection points V1, V2. The insulation body 116 encloses all bare conductors and current carrying metal parts. The spacers 124 hold the connection points V1, V2 in place inside the insulation body 116 after the half shells 202, 203 are connected. The half shells 202, 203 are provided with in-molded elastic spring contacts 206, 207. The spring contacts 206, 207 make electrical contact to the crimp sleeves 123 and via the crimp sleeves 123 to the screen 114 of each incoming line 101-103. The elastic spring contacts 206, 207 will be described in greater detail further below with reference to FIGS. 3 and 4. The elastic spring contacts 206, 207 are made from spring metal with good electric conductivity, e.g. in the range of $5\times10^6$-$60\times10^6$ S/m.

For protection against environmental influences such as dirt, humidity etc. the power distributor 200 comprises a housing 126 to enclose the electrical parts of the power distributor 200. A sealing mat 127 tightly closes an opening 128 of the housing 126. A stopper 129 cooperates with the housing 126 to secure the correct positioning of the sealing mat 127 in the opening 128 of the housing 126. The stopper 129 is provided with protrusions 130a, 130b, which are placed between the lines 101, 102 and 102, 103, respectively, to separate the lines. A cover 131 closes the housing and is held in position by cooperating latching means provided on the housing 126 and to the cover 131, respectively.

Figure 3:
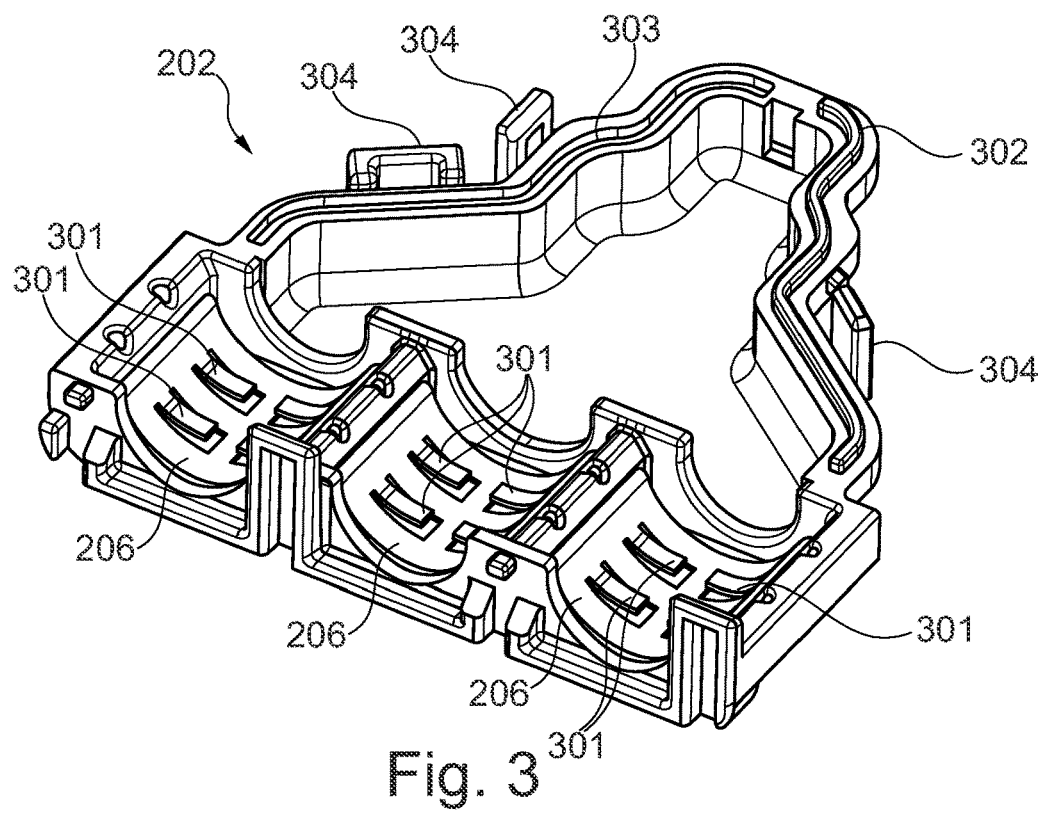
FIG. 3 a lower half shell of the screen shield shown in FIG. 4.

FIG. 3 shows the lower half shell 202 in greater detail including the in-molded elastic spring contacts 206. Each spring contact 206 includes four cutout spring tongues 301 which are bent in a radial direction towards an imaginary center of the half circular spring contact 206. For mounting the two half shells 202, 203 together, the lower half shell 202 is provided with a ridge 302 and a groove 303 on the face to be joined with the upper half shell 203 that is provided with complementary structures. The ridges 302 and grooves 303 facilitate the correct assembly of the half shells 202, 203 and diminish—or completely close—the gap between both half shells to improve the performance of the shielding effect against electromagnetic interference. The half shells 202, 203 are furnished with cooperating latching means 304 that hold together the half shells 202, 203.

Figure 4:
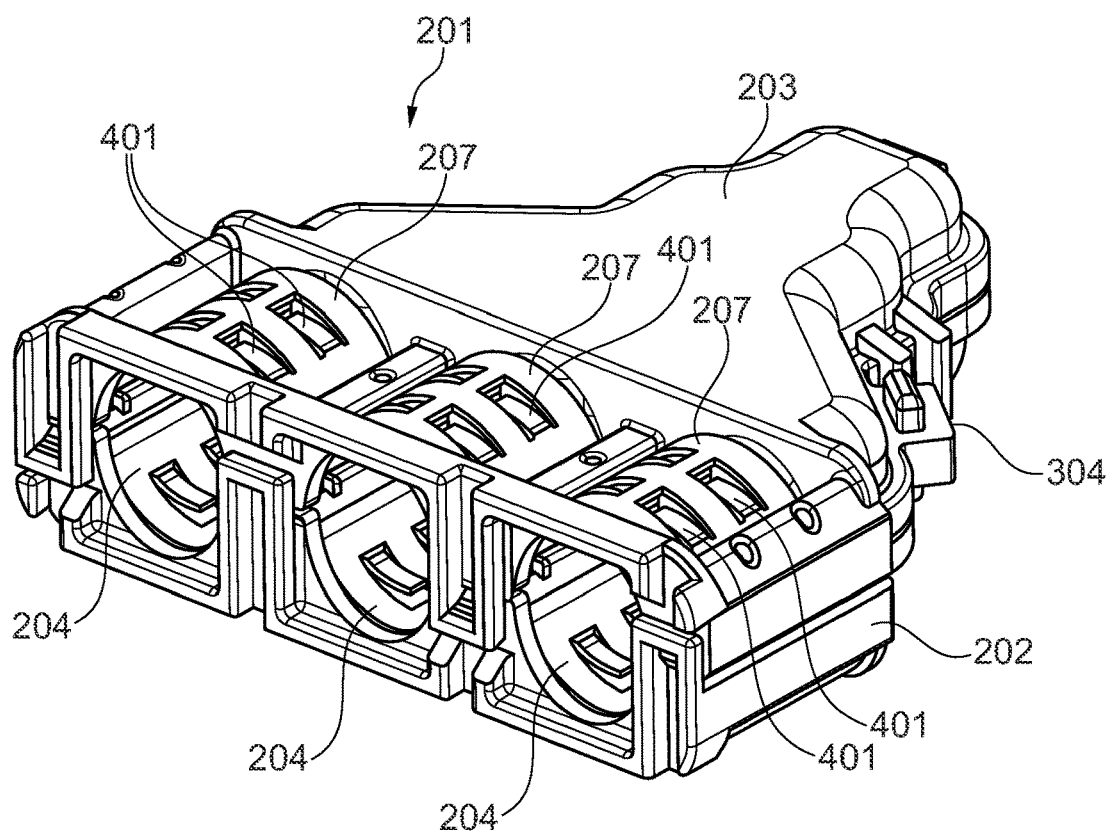
FIG. 4 a screen shield made from electrically conducting plastic material with integrated elastic springs.

FIG. 4 illustrates the screen shield 201 when the half shells 202, 203 are mounted together. The elastic spring elements 207 are in-molded parts of the upper shell 203. Each spring element 207 is provided with four cutout spring tongues 401 which are bent in a radial direction towards an imaginary center of the half circular spring contact 207. The spring contacts 206, 207 form a hollow cylinder with an inner diameter that essentially corresponds to the outer diameter of the crimp sleeves 123 except where the spring tongues 301, 401 are bent towards the center of the hollow cylinder. When the crimp sleeves 123 of the lines 100-103 are placed inside the spring contacts 206 of the lower half shell 202 and the upper half shell is latched together with the lower half shell, then the spring tongues 301, 401 are bent radially outside to make room for the crimp sleeves 123. As a result, the spring tongues 301, 401 exert an elastic force onto the crimp sleeves 123 and establish a good friction-locked electrical contact to the crimp sleeves 123. At the same time, the in-mold spring contacts 206, 207 make good electrical contact to the half shells 202, 203 made from electrically conducting material. It has been found that this structure provides for better electrical contacts and then compared to with a screen shield that contacts the screens 114 of incoming lines 101-103 with elastic spring contacts which are made from conducting plastic material.

The spring contacts 206, 207 contacting the screens 114 of the lines 101-103 provide for an electrically conducting path between the screens 114 of the lines 101-103. The electrically conducting path enables to transfer currents from line screen 114 to line screen 114 of the lines 101-103. The metal spring contacts 206, 207 are better suited for this purpose than contacts made from conductive plastic because of the lower contact resistance. Typical requirements for contact resistance and delta transfer impedance between screens can thus be met. The other parts of the screen shield 201 only provides for a shielding effect and consequently only must meet the requirements for shielding attenuation. The electrical conductivity of electrically conducting plastic is sufficient for this purpose.

In other embodiments the spring contacts 206, 207 are provided with fewer or more spring tongues 301, 401.

In an alternative embodiment the metal spring contacts are replaced by spring contacts integrally molded with half shells which simplifies the manufacturing of the screen shield. Thus, instead of the metal spring contacts, the spring contacts are also made from electrically conducting plastic material. This alternative embodiment can be employed in applications where the electrical contact provided by the plastic spring contact is found to be sufficient to satisfy reduced conductivity requirements.

Figure 5:
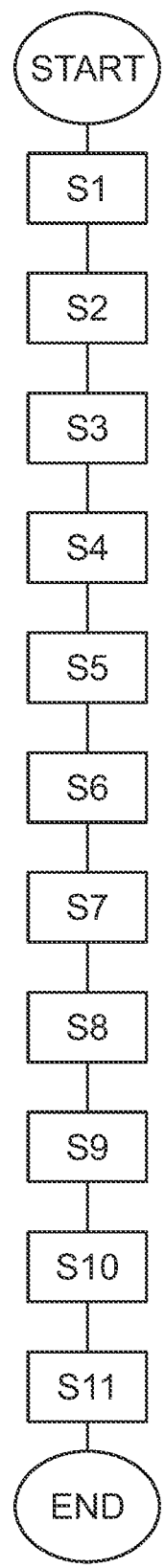
FIG. 5 a schematic flow diagram of a method for manufacturing a high-power distributor according to the present disclosure.

FIG. 5 shows a schematic flow diagram illustrating a method for manufacturing the power distributor 200. In a first step S1 the outer insulation jacket 115 of the incoming lines 101-103 is removed. In step S2 the insulation 108 from conductors 106, 107 is removed as well to provide access to the bare metal of the conductors 106, 107. In step S3 the conductors 106, 107 are connected at connection points V1, V2 for instance by ultrasonic welding. However, other connection technologies can be used as well, e.g. resistance welding, Laser welding, friction stir welding, and plasma welding to name only a few. In step S4 the screen 114 is lifted from the inner insulating 113 jacket to make room for an under-crimp sleeve 122. For instance, the screen can be folded back by 90° allowing to put in the under-crimp sleeve directly on the inner insulating jacket 113. Then, the under-crimp sleeve 122 is crimped in step S5 onto the insulating jacket 113. In step S6 the screen from 114 is placed back onto the under-crimp sleeve 122. In step S7 the crimp sleeve 123 is put on top of the screen 114 and the under-crimp sleeve 122 and then crimped in step S8. In step S9 all bare conductors and the connection points V1, V2 are enclosed in the insulating body 116, which subsequently is enclosed in the screen shield 201 in step S10. Finally, in step S11 the electrically insulating housing 126 encloses the screen shield 201.

In the claims, the word "comprising" does not exclude other elements or steps, and the indefinite article "a" does not exclude a plurality.

A single unit or device may perform the functions of multiple elements recited in the claims. The fact that individual functions and elements are recited in different dependent claims does not mean that a combination of those functions and elements could not advantageously be used.

LIST OF REFERENCE SIGNS

100 Power distributor
101—Incoming lines
103
106, 107 Conductors
108 Insulation
111, 112 Individual lines
113 Inner insulating jacket
114 Screen
115 Outer insulation jacket
116 Insulation body
117 Screen shield
118 Lower half shell
119 Upper half shell
121 Half circular extension
122 under-crimp sleeve
123 Crimp sleeve
124 Spacer
126 Housing
127 Sealing mat
128 Opening
129 Stopper
130a,b Protrusion
131 Cover
201 Screen shield
202 Lower half shell
203 Upper half shell
206, 207 Spring contact
301 Spring tongue
302 ridge
303 Groove
304 Latching means
401 Spring tongue

The invention claimed is:

1. A power distributor comprising:
   at least two incoming lines,
   wherein each line comprises a conductor and an individual screen,
   wherein the conductors of the incoming lines are connected at a connection point, which is enclosed by a screen shield that contacts each individual screen of the incoming lines, and wherein the screen shield is made from electrically conducting plastic material, wherein the screen shield comprises elastic spring contacts contacting the screens of the incoming lines, wherein the elastic spring contacts are made from metal and are molded together as in-mold parts with the screen shield, and the elastic spring contacts are electrically connected with each other.

2. The power distributor according to claim 1, wherein the elastic springs contacts comprise one or several spring tongues.

3. The power distributor according to claim 1, wherein the lines comprise a plurality of conductors, which are connected with other conductors of the other incoming lines at a plurality of connection points.

4. The power distributor according to claim 1, wherein the power distributor comprises an insulation body which is arranged inside the screen shield, and that the insulation body is adapted to separate connection points between the conductors.

5. The power distributor according to claim 4, wherein spacers are arranged between conductors of different incoming lines fixing the connection points at predefined positions inside the insulation body.

6. The power distributor according to claim 1, wherein the power distributor comprises a housing made of insulating plastic material enclosing the screen shield.

7. A method for manufacturing a power distributor with at least two incoming lines, wherein each line comprises a conductor and an individual screen, wherein the conductors of the incoming lines are connected at a connection point, which is enclosed by a screen shield that contacts each individual screen of the incoming lines, wherein the screen shield is made from electrically conducting plastic material, wherein the screen shield comprises elastic spring contacts contacting the screens of the incoming lines, said method comprising
   removing an outer insulation jacket of incoming lines;
   removing an insulation form conductors of the incoming lines;
   electrically connecting the conductors of the incoming lines;
   lifting a screen from an inner insulating jacket to make room for an under-crimp sleeve;
   crimping the under-crimp sleeve onto the inner insulating jacket;
   placing the screen back onto the under-crimp sleeve;
   placing the crimp sleeve on top of the screen and the under-crimp sleeve;
   crimping the crimp sleeve;
   enclosing bare conductors in an insulating body;
   enclosing the insulating body in a screen shield molded from electrically conducting plastic material comprising in-mould metallic spring contacts.

8. The method according to claim 7, further comprising arranging an electrically insulating housing around the screen shield.

* * * * *